US012614706B2

(12) United States Patent
De Bosscher et al.

(10) Patent No.: US 12,614,706 B2
(45) Date of Patent: Apr. 28, 2026

(54) MAGNETRON WITH CONTROLLER FOR MONITORING AND CONTROL

(71) Applicant: SOLERAS ADVANCED COATINGS BV, Deinze (BE)

(72) Inventors: Wilmert De Bosscher, Drongen (BE); Ivan Van De Putte, Waregem (BE); Niek Dewilde, Kruishoutem (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 0 days.

(21) Appl. No.: 17/286,590

(22) PCT Filed: Oct. 22, 2019

(86) PCT No.: PCT/EP2019/078778
§ 371 (c)(1),
(2) Date: Apr. 19, 2021

(87) PCT Pub. No.: WO2020/083948
PCT Pub. Date: Apr. 30, 2020

(65) Prior Publication Data
US 2021/0391158 A1      Dec. 16, 2021

(30) Foreign Application Priority Data
Oct. 22, 2018    (BE) .................................. 2018/5728

(51) Int. Cl.
*H01J 37/34* (2006.01)
*C23C 14/35* (2006.01)
*C23C 14/54* (2006.01)

(52) U.S. Cl.
CPC .......... *H01J 37/3476* (2013.01); *C23C 14/35* (2013.01); *C23C 14/54* (2013.01); *H01J 37/3405* (2013.01); *H01J 37/3435* (2013.01)

(58) Field of Classification Search
CPC ...... C23C 14/35; C23C 14/54; H01J 37/3476; H01J 37/3405; H01J 37/3435
See application file for complete search history.

(56) References Cited

U.S. PATENT DOCUMENTS

| | | | |
|---|---|---|---|
| 3,878,085 A | 4/1975 | Corbani | |
| 4,995,958 A | 2/1991 | Andserson et al. | |
| 5,096,562 A | 3/1992 | Boozenny et al. | |
| 5,200,049 A | 4/1993 | Stevenson et al. | |

(Continued)

FOREIGN PATENT DOCUMENTS

| | | |
|---|---|---|
| CN | 1653206 A | 8/2005 |
| CN | 201614406 U | 10/2010 |

(Continued)

OTHER PUBLICATIONS

International Search Report and Written Opinion from PCT Application No. PCT/EP2019/078778, Jan. 13, 2020.

(Continued)

*Primary Examiner* — John J Brayton
(74) *Attorney, Agent, or Firm* — Workman Nydegger

(57) ABSTRACT

A magnetron structure is described for use in a sputtering apparatus. The magnetron structure comprises a magnetron and a controller rigidly connected to the magnetron. The controller is adapted for at least partly controlling a condition and/or a functioning of the sputtering unit.

19 Claims, 3 Drawing Sheets

402          401

(56) References Cited

U.S. PATENT DOCUMENTS

| | | | |
|---|---|---|---|
| 5,620,577 | A | 4/1997 | Taylor |
| 6,322,679 | B1 | 11/2001 | De Bosscher et al. |
| 8,114,256 | B2 | 2/2012 | Chang et al. |
| 8,721,847 | B2 | 5/2014 | Chang et al. |
| 10,163,611 | B2 | 12/2018 | De Bosscher et al. |
| 2003/0136672 | A1* | 7/2003 | Barrett ................ H01J 37/3435 |
| | | | 204/298.22 |
| 2004/0026235 | A1 | 2/2004 | Stowell, Jr. |
| 2005/0133365 | A1 | 6/2005 | Hong et al. |
| 2006/0054494 | A1* | 3/2006 | Reiss ................... C23C 14/505 |
| | | | 204/192.12 |
| 2006/0260938 | A1 | 11/2006 | Petrach |
| 2009/0139854 | A1 | 6/2009 | Chang et al. |
| 2010/0055296 | A1* | 3/2010 | Bankmann ........... C23C 14/505 |
| | | | 118/712 |
| 2010/0126852 | A1 | 5/2010 | Ohmi et al. |
| 2012/0097528 | A1 | 4/2012 | Teer |
| 2012/0103800 | A1 | 5/2012 | Chang et al. |
| 2013/0341420 | A1 | 12/2013 | Lister et al. |
| 2014/0246310 | A1* | 9/2014 | Crowley ............. H01J 37/3455 |
| | | | 204/298.03 |
| 2015/0262798 | A1* | 9/2015 | Binns ................ H01J 37/32935 |
| | | | 204/298.03 |
| 2016/0376695 | A1* | 12/2016 | Yang ...................... G01N 29/11 |
| | | | 204/298.03 |
| 2017/0029940 | A1 | 2/2017 | Van De Putte et al. |

FOREIGN PATENT DOCUMENTS

| | | | |
|---|---|---|---|
| JP | 2002500087 A | * | 1/2002 |
| JP | 2008540848 A | | 11/2008 |
| JP | 2017511429 A | | 4/2017 |
| JP | 2018501404 A | | 1/2018 |
| TW | 200935985 A | | 8/2009 |
| WO | 2015183554 A1 | | 12/2015 |

OTHER PUBLICATIONS

Belgian Search Report from corresponding BE Application No. BE201805728, Jul. 9, 2019.

Chinese Office Action from corresponding CN Application No. 201980068779.1, Jun. 4, 2024.

Chinese Search Report from corresponding CN Application No. 11220930040, Sep. 18, 2023.

Chinese Office Action from Corresponding Chinese Patent Application No. CN201980068779.1, Dec. 16, 2024.

* cited by examiner

MAGNETRON WITH CONTROLLER FOR MONITORING AND CONTROL

FIELD OF THE INVENTION

The present invention relates to sputtering units for sputtering material from a target to cover a substrate. More particularly, the present invention relates to magnetron structures or sputtering units comprising such magnetron structures allowing monitoring and controlling the functioning or condition of a sputtering unit.

BACKGROUND OF THE INVENTION

Sputtering material from a target to cover a substrate has become common practice in a wide range of technical fields such as integrated circuit manufacture, large area glass coating and nowadays more and more for the coating of flat panel displays. Such sputtering takes place under a reduced pressure atmosphere wherein sputtering or reactive gases or mixtures of both are admitted in a controlled way. Free electrons hopping in a magnetically confined racetrack ionize the gas atoms or molecules in the vicinity of the target surface. These ions are subsequently accelerated towards the target that is negatively biased, thereby dislodging the target atoms and giving them enough kinetic energy to reach the substrate and coat it. The shape of the racetrack is defined by a static magnetic array, close to that target surface that is opposite to the surface that is being sputtered. Such a deposition process is commonly called "magnetron sputtering" due to the presence of the magnetic array.

A plethora of apparatus has been developed, designed and built with a specific application in mind. The first, smaller magnetron sputtering unit used stationary planar targets initially prevalently circular in form (i.e. like the silicon wafer that was sputtered upon). Later also elongated, rectangular shapes for coating of larger substrates that pass under the target became available (e.g. as described in U.S. Pat. No. 3,878,085). Such elongated planar targets are now commonly used in dedicated 'display coaters' for the manufacturing of flat panel displays like liquid crystal displays (LCD) and plasma screens. These planar targets are usually mounted in the access doors of the apparatus; the target surface being easily accessible (with doors open) and spanning the length of and even extending over the substrate width. In a display coater the substrate to be coated is held under a slant angle (7° to 15°) out of the vertical and leans on a conveying system. As the target must be parallel to the substrate in order to obtain a uniform coating, the target must be mounted under substantially the same angle.

Stationary targets are easy to cool and energize (as they are static with respect to the apparatus), but they have the disadvantage that the target material is only eroded away beneath the racetrack. The useable lifetime of the target thus being limited to that point in time just before the target is first punctured. The problem of non-uniform erosion can be dealt with by introducing a magnet array that rotates relative to the target surface (such as e.g. introduced in U.S. Pat. No. 4,995,958 for circular planar magnetrons) or that translates relative to the target surface (such as e.g. described in U.S. Pat. No. 6,322,679 for elongated planar magnetrons). Such constructions—although alleviating the uneven erosion problem to a great extent—make the system more complex.

Large area coaters to coat e.g. window glass with all kinds of stacks of functional coatings are usually equipped with a rotating, cylindrical sputtering target. In this application the economic driver is throughput at a low material cost and a good quality. Rotating cylindrical targets are the ideal choice for that, as they can span large widths and can be used for a long period of time. The trade-off is that the target itself is rotating relative to the apparatus and hence a complex and space occupying endblock' is needed to bear, rotate, energize, cool and isolate (coolant, air and electricity) the rotating target while holding the magnet array inside, being fixed or possible rotationally configured. Several types of arrangement exist amongst which for example double right-angled endblocks, a single straight-through endblock or single angled endblock.

Double, right-angled endblocks such as disclosed in U.S. Pat. No. 5,096,562 (FIG. 2, FIG. 6) and US 2003/0136672 A1 wherein the means for bearing, rotating, energizing, cooling and isolation (air, coolant and electrical) are divided between two blocks, situated at either end of the target. With right-angled is meant that the endblocks are mounted to the wall that is parallel to the rotation axis of the target. These endblocks are usually mounted at the bottom of a top-box containing ancillary equipment. The top-box with endblocks and mounted target can be lifted in its entirety out of the large area coater for easy target replacement and servicing.

Single, straight-through endblocks such as disclosed in U.S. Pat. No. 5,200,049 (FIG. 1) wherein the means for bearing, rotating, energizing, cooling and isolation are all incorporated in one endblock and the target is held cantilevered inside the large area coater. With 'straight-through' is meant that the rotation axis of the target is perpendicular to the wall on which the endblock is mounted. 'Semi-cantilevered' arrangements are also described (U.S. Pat. No. 5,620, 577) in that the end of the target farthest from the endblock is held by a mechanical support (without any other functionalities incorporated in that support).

Control of the different functionalities provided by a magnetron (for use with planar or cylindrical targets) or, more generally, of the different functionalities of the sputtering unit at present typically is performed using a controller external to the sputtering unit. Control thus is performed by transmitting control signals from the controller outside the sputtering unit over a signal transmitting cable to the magnetron in the vacuum.

Furthermore, although the use of sensors for sensing properties of the sputtering unit is known, there is still room for improving monitoring of the sputtering unit.

SUMMARY OF THE INVENTION

It is an object of embodiments of the present invention to provide magnetron structures, and/or to provide sputtering units comprising such magnetron structures allowing good monitoring and/or control of the functioning and/or condition of a sputtering unit or a sputtering process performed by such unit.

It is an advantage of embodiments of the present invention to provide magnetron structures and/or to provide sputtering units comprising such magnetron structures that allow easy installation since at least part of the monitoring and/or control functionality in the sputtering unit is automatically installed when installing the magnetron.

It is an advantage of embodiments of the present invention to provide magnetron structures and/or to provide sputtering units comprising such magnetron structures that allow more easy revision of the magnetron structures during maintenance since information regarding operation, including deviation of normal operation, can be available from the magnetron structure, even when demounted from the sputtering unit. In this way, e.g. faulty operation can more easily detected.

It is an advantage of embodiments of the present invention that faulty states of components of the magnetron can be easily detected, e.g. during revision of the magnetron. The latter can advantageously be performed in embodiments wherein monitoring data of the functioning and/or condition of the magnetron or the sputtering unit are available over time. In embodiments of the present invention such data can advantageously be available in the magnetron itself, such that the data is easily accessible during revision of the magnetron. This allows amongst others also pro-active replacement of components, or allows maintaining components longer in operation, since the actual use time of components can be monitored.

In a first aspect, a magnetron structure is provided, for use in a sputtering apparatus. The magnetron structure comprises a magnetron and a controller, which may be implemented as an integrated circuit, the controller being rigidly connected to the magnetron. The controller, which may be implemented as an integrated circuit, is configured (e.g. programmed) for at least partly controlling a condition and/or a functioning of the sputtering apparatus. The controller may be a microcontroller. In some embodiments, the controller may be a low voltage microcontroller. It is an advantage of embodiments of the present invention that the controller can actually perform processing of data, such that a condition or a functioning of the sputtering apparatus can be controlled by the controller.

The controller may in addition be adapted for furthermore at least partly performing monitoring of a condition and/or functioning of the sputtering apparatus.

It is an advantage of embodiments of the present invention that at least part of the data processing can be integrated within the magnetron. It is an advantage of embodiments of the present invention that there is no need of human interaction for processing the data.

In some embodiments of the present invention, the controller, e.g. integrated circuit, of the magnetron structure comprises a data processor for processing signals into data, or vice versa.

In some embodiments of the present invention, the controller, e.g. integrated circuit, further comprises data storage, for storing the data related to the at least partly monitoring and/or controlling of a condition and/or a functioning of the sputtering apparatus.

It is an advantage of embodiments that data regarding the monitoring and/or controlling of a condition and/or functioning of the sputtering apparatus over time can be stored locally. It is an advantage of embodiments of the present invention that information regarding the condition or functioning of the sputtering apparatus is stored at the magnetron, such that during revision or upon malfunctioning, the condition or functioning of the sputtering apparatus can be evaluated. It is an advantage of embodiments of the present invention that data can be stored and compared with data obtained at a different moment of time, thus obtaining dynamic monitoring of the condition of the sputtering apparatus, allowing long-term follow-up and early detection of worsened conditions (such as aging of sealings, for example).

In some embodiments of the present invention, the magnetron is an endblock adapted for supporting a tubular (e.g. cylindrical) magnet bar and sputter target.

In some embodiments, the magnetron may be adapted for mounting a planar target and sputtering from a planar target.

In some embodiments of the present invention, the magnetron structure further comprising a sensor, for sensing sensor signals related to the sputtering apparatus or the sputtering process. The controller, e.g. integrated circuit, is adapted to receive and process signals from the sensor.

It is an advantage of embodiments of the present invention that the status of the process, of the target, or of any other subsystems (such as bearings or cooling systems) can be monitored in situ and during the use of the sputtering apparatus.

In some embodiments of the present invention, the controller, e.g. integrated circuit, further comprises a communication component for interchanging data with a controller external to the vacuum part of the sputtering apparatus. In particular embodiments, the communication component is adapted for performing wireless communication (using any of WIFI communication, Bluetooth communication, optical communication or any other type of EM radiation) or for performing wired communication (using any of optical fiber communication or electrical communication).

The communication component may comprise a connector for interchanging data between the exterior non-vacuum part of the sputtering apparatus and the controller, e.g. integrated circuit.

It is an advantage of embodiments of the present invention that a read-out for reading the data or activating an alarm, and/or a command input, can be used in combination with the magnetron.

In some embodiments of the present invention, the magnetron further comprises a controller for controlling at least one actuator for adjusting a parameter related to the sputtering process in a sputtering apparatus.

It is an advantage of embodiments of the present invention that automatization of the process can be obtained.

Further, the controller can be adapted for controlling at least one actuator, for adjusting the parameter, within a desirable window.

It is an advantage of embodiments of the present invention that the processor can control automatically a parameter within a range and with reduced need of human interaction, so high degree of independency with the exterior can be attained.

In some embodiments of the present invention, the magnetron structure further comprises a power source for powering the controller, e.g. integrated circuit. The power source may be a battery, or a power extractor adapted to obtain power from a cooling fluid flow or an electrical powering of the target tubes.

In some embodiments of the present invention, powering of the controller, e.g. integrated circuit is based on a wired connection from the exterior non-vacuum part of the sputtering apparatus.

It is an advantage of some embodiments of the present invention that use of batteries is avoided, so there is less need of maintenance.

In some embodiments of the present invention, the magnetron comprises a top part for holding the target, and a bottom part attachable to the top part. The controller, e.g. integrated circuit may be rigidly connected to the bottom part.

It is an advantage of embodiments of the present invention that the controller, e.g. integrated circuit is easily accessible from the exterior of the unit, allowing easy installation and maintenance.

In some embodiments of the present invention, the magnetron structure comprises a wireless connector including an antenna for transmitting data outside of the system.

It is an advantage of embodiments of the present invention that no wired connection is needed to an external control system (such as a computer), thus obtaining a highly compact endblock with no need of extra wires for data transmission, either into or outside the unit.

It is an advantage of embodiments of the present invention that a single connection (e.g. a single wired connection, or even a single wireless connection) can be used to power the controller, e.g. integrated circuit, and to interchange data to and from the controller, e.g. integrated circuit, thus simplifying the endblock system by reducing the amount of connections to external control and/or to power sources. Alternatively, different connections or a multi-wire connection may be used.

In some embodiments of the present invention, the data is any or a combination of cooling liquid related information, sputter power related information, magnetics related information, magnetron condition related information or target driving related information.

The cooling liquid related information may be any or a combination of but not limited to incoming temperature of the cooling liquid, outgoing temperature of the cooling liquid, pressure of the cooling liquid, flow rate of the cooling liquid or resistivity of the cooling liquid. The sputter power related information may be any or a combination of but not limited to voltage towards the target, voltage on specific parts such as for example by induction, electrical current through the system, spectral content or impedance. Magnetics related information may be any or a combination of but not limited to type of magnet configuration, positioning of the magnet configuration such as global positioning like translational or rotational position or speed of movement, o local positioning, temperature or magnetic strength. The magnetron condition related information may be any or a combination of but not limited to temperature close to the target, temperature on specific parts of the magnetron, pressure inside the system, humidity or cooling liquid. The target driving related information may be any or a combination of but not limited to rotation or movement speed, operational lifetime, driving unit electrical current or torque level over time or temperature.

The controller, e.g. integrated circuit may provide information for facilitating maintenance while being in use, giving information about its status and about the projected moment of required preventive maintenance.

The controller, e.g. integrated circuit may provide information for facilitating maintenance while being in revision to understand the historic data thus facilitating adequate revision and maintenance.

In a second aspect, a sputtering apparatus is provided, the apparatus comprising a magnetron structure according to any embodiment of the first aspect, and a magnet configuration.

In a third aspect, use of a controller, e.g. an integrated circuit, in a magnetron structure is provided, for at least partly controlling a condition and/or a functioning of the sputtering apparatus. The controller may be further configured for also at least partly monitoring a condition and/or functioning of the sputtering apparatus.

It is an advantage of embodiments of the present invention that a circuit with processing power can be used in combination with a magnetron. This allows an easy control and/or readout interface, by reducing set-up hurdles such as software installation, connection between external computing systems and a plurality of connectors from sensors of the sputtering unit, etc. A highly compact and "smart" magnetron can be obtained.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
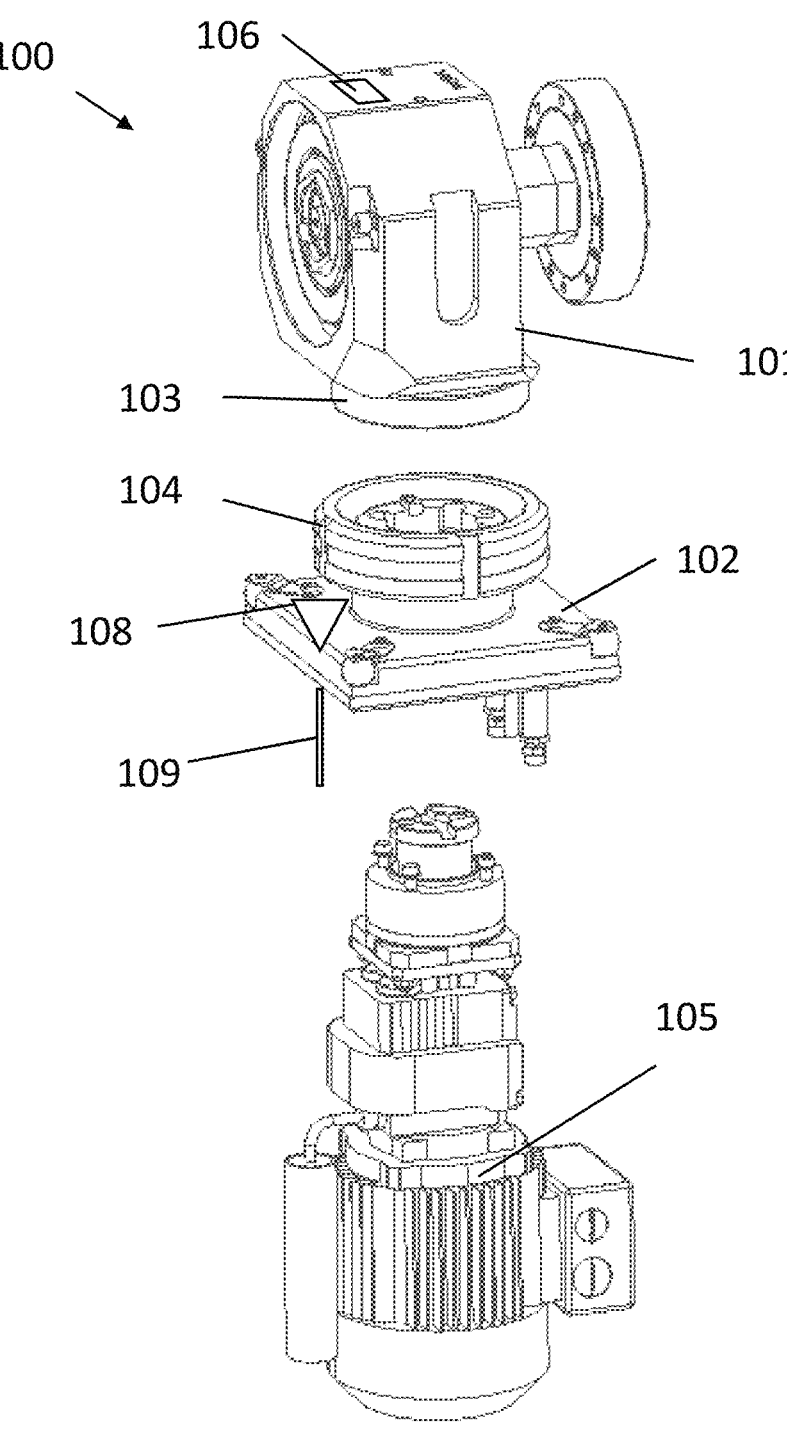
FIG. 1 illustrates a magnetron structure in accordance with embodiments of the present invention in exploded view, including a motor.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a magnetron structure, reference is made to a magnetron and a controller, e.g. an integrated circuit, rigidly connected thereto. The integrated circuit may be positioned inside the magnetron or may be attached to the magnetron, a particular part thereof or a housing thereof. The magnetron may comprise a top part for mounting a target thereon, a housing and a bottom part for mounting the magnetron to the rest of the sputtering unit. The controller, e.g. integrated circuit, thereby may be rigidly attached to the top part, the housing or the bottom part, or being located inside any of these components.

Furthermore, where reference is made to a magnetron structure, reference can be made to a system for use with a planar target as well as to a system for use with a cylindrical target. In the latter case, the magnetron structure also may be referred to as endblock structure and the magnetron may be referred to as endblock. In some specific embodiments, the top part may correspond with an endblock head for mounting the cylindrical target and/or a corresponding magnet bar.

In such embodiments, the bottom part also may correspond with a base plate, which typically is used for mounting the endblock to the rest of the sputtering apparatus.

A top part of a magnetron structure may be exposed to the harsh environment of the plasma (e.g. heating, bombardment, . . . ) and may contain all the critical components of the magnetron structure requiring periodic inspection or maintenance; e.g. containing wear parts (e.g. dynamic seals, brushes for transferring a signal or power, sliding and rolling parts, . . . ), or requiring clean-up or lubrication, or any other intervention. A top part may consist of or comprise a subassembly that may be easily removed or replaced for revision and fast exchange. This allows for minimal downtime of the sputtering apparatus, while the revision, or update of the subassembly may be done separately without impacting the functionality of the sputtering apparatus (off-site, or in an area not necessarily linked to the sputtering apparatus).

A bottom part may be more rigidly connected to the sputtering apparatus; e.g. bolted onto the wall, cover, lid or part of the sputtering apparatus, for example a part of the vacuum chamber. A bottom part may be less sensitive to aging, may be less exposed to the harsh environment and may be preferentially not requiring any periodic inspection or revision. It may be a part interfacing to the top part for allowing the sputtering process to work, but for most of the cases being considered as belonging to the sputtering apparatus. The magnetron structures thus may consist of a single large construction or of multiple constructions as described herein, having a top part and a bottom part.

Where in embodiments of the present invention reference is made to a sputtering unit, reference is made to a system comprising a magnetron structure and a magnet configuration (i.e. a magnet bar in the case of a system for cylindrical targets). The sputtering unit typically may be positioned in a vacuum chamber thus forming part of a sputtering apparatus. Other components in such a sputtering apparatus may be a vacuum pumping system, a substrate holder, etc. and are well known by the person skilled in the art.

Where in embodiments of the present invention reference is made to processing of signals or processing of data, reference may be made to changing, altering, calculating, applying a predetermined algorithm thereto, etc. Where in embodiments reference is made to communicating, this may include sending, storing, retrieving, etc.

In a first aspect, the present invention relates to a magnetron structure for use in a sputtering apparatus. The magnetron structure comprises a magnetron and a controller, which may be implemented as an integrated circuit, the controller being rigidly connected to the magnetron. The controller is configured for controlling a condition and/or a functioning of the sputtering apparatus. In some embodiments, the controller may furthermore be configured for at least partly monitoring a condition and/or a functioning of the sputtering apparatus. In some particular embodiments, the controller may comprise a data processor for processing signals into data or vice versa. Such data can be stored and/or used for the monitoring or controlling of the sputtering apparatus. The controller may be a microcontroller, such as for example a low voltage microcontroller.

It is to be noticed that according to embodiments of the present invention the magnetron structure may be for use with a flat target as well as for use with a cylindrical target. In the following, reference will often be made to magnetron structures for use with a cylindrical target (in such cases by referring to endblock structures and endblocks), since this illustrates some additional problems in view of movement of the target used in a vacuum system under vacuum conditions, where monitoring and controlling according to embodiments of the present invention can advantageously be used. Nevertheless, similar teachings can be mutates mutandis applied to structures for flat targets, which thus also are envisioned.

An endblock is preferably mountable as a single unit on a sputtering apparatus, although a wall-integrated endblock could be envisaged as well. Parts that are removable with the target tube or the removable magnet bar assembly sometimes may be considered as not to belong to the endblock. The primary function of the endblock is to carry the target. It may also be configured to revolve the target around an axis of rotation. As sputtering is performed under a low gas pressure, the endblock must be gastight at all times and surely when it is rotating. As the sputtering of the target generates a lot of heat on the target surface, the target must be cooled which is normally done with water or another suitable coolant or cooling fluid. This coolant must be fed and evacuated through the endblock. Also, the target must be fed with an electrical current in order to maintain the target above a certain electric potential. Again this electrical current must pass through the endblock. In order to incorporate all these functions, an endblock may comprise different means.

A.) A drive means (e.g. a driver) to make the target rotate, e.g. worm-gear system, or a cylindrical gear-gear system or a conical gear-gear crossed axis system, or a pulley-belt system, or any other means known in the art to make the target rotate.

B.) An electrical contact means (e.g. a rotatable contact, a connector) to provide electrical current to the target. This may be achieved by means of an electrical commutator equipped with brushes that are in sliding contact with a commutator ring. Instead of a brush-and-ring arrangement, also two rings sliding against each other can be used, or a conducting belt type of connection can be used such as a metallic belt. The latter solution conveniently combines the drive means radial to the electrical contact means.

C.) Bearing means, for example a bearing. Depending on the weight of the target, more than one bearing may be necessary. The person skilled in the art will readily select that type of bearings that are appropriate from the different types known such as ball bearings, roller bearings, plain bearings, axial bearings or any other type known in the art.

D). At least one coolant seal, e.g. rotatable coolant seal. These coolant seals ensure that coolant will not leak into the endblock or—even worse—into the vacuum apparatus or sputtering chamber while fixed and rotatable parts of an endblock turn relative to one another. In order to reduce this risk, a number of coolant seals are introduced in cascade. Typically lip seals are used as coolant seal as they are well known in the art. However, other types—without being exhaustive—of seals like mechanical face seals or labyrinth seals are not excluded.

E.) Finally at least one vacuum seal, such as a rotatable vacuum seal, can be included. These vacuum seals ensure the integrity of the vacuum while fixed and rotating parts of the endblock rotate relative to one another. A cascading series of vacuum seals—progressively protecting the vacuum—is preferred in order reduce the risk of having a vacuum leak. Again different seals are known, of which the lip seal is most popular, although other types of seals—such as ferrofluidic seals—can of course be used as well.

As indicated above, the magnetron may comprise a magnetron top part typically hosting the different means described above, a magnetron bottom part for mounting the magnetron into the system and for making connections between a vacuum side and a non-vacuum side of the sputtering apparatus.

According to embodiments of the present invention, a controller, e.g. an integrated circuit, is rigidly attached to the magnetron, i.e. to the top part, the bottom part or the housing. In some embodiments, the controller may be positioned inside the top part of the magnetron or the bottom part of the magnetron. According to at least some embodiments of the present invention, at least part of the processing from signals to data or vice versa is performed in the controller.

In some embodiments of the present invention, signals, e.g. signals from sensors (sensor signals), can be received in the controller, and processed into data for monitoring or controlling the status of the sputtering apparatus or components thereof or the status of a sputtering process. The data can be further used, stored or communicated to a further device, e.g. outside the vacuum chamber. The magnetron structure therefore also may comprise a data storage means and/or a data communication means.

In some embodiments of the present invention, control data, optionally stemming from outside the vacuum part of the sputtering apparatus, may also be transferred to and processed in the controller for generating control signals in the magnetron for controlling components of the magnetron or the sputtering apparatus. For example, a control signal may be received from an input command console (for example, outside the vacuum part of the sputtering apparatus) and processed. These can also be stored. The control data, related to controlling the status of the unit or of the sputtering process, can be used by the controller to control actuators within the vacuum part of the sputtering apparatus, e.g. within the magnetron.

In some embodiments, both monitor data and control data can be handled by the controller of the magnetron.

In some embodiments, the controller can receive signals from sensors, provide processed monitor data, and use such information to generate control data, which can be used to control, adjust or to fine-tune the sputtering apparatus or the sputtering process, by sending such control data to the actuators, with less need of human interaction. Thus, an automatized sputtering process can be provided, whereby little or no communication with the space outside the vacuum chamber needs to be present.

By way of illustration, embodiments of the present invention not being limited thereto, standard and optional features will now further be described with reference to the drawings. Again reference is made to a magnetron structure for a cylindrical target, but the features can be mutates mutandis applied to a magnetron structure for a planar target.

Figure 2:
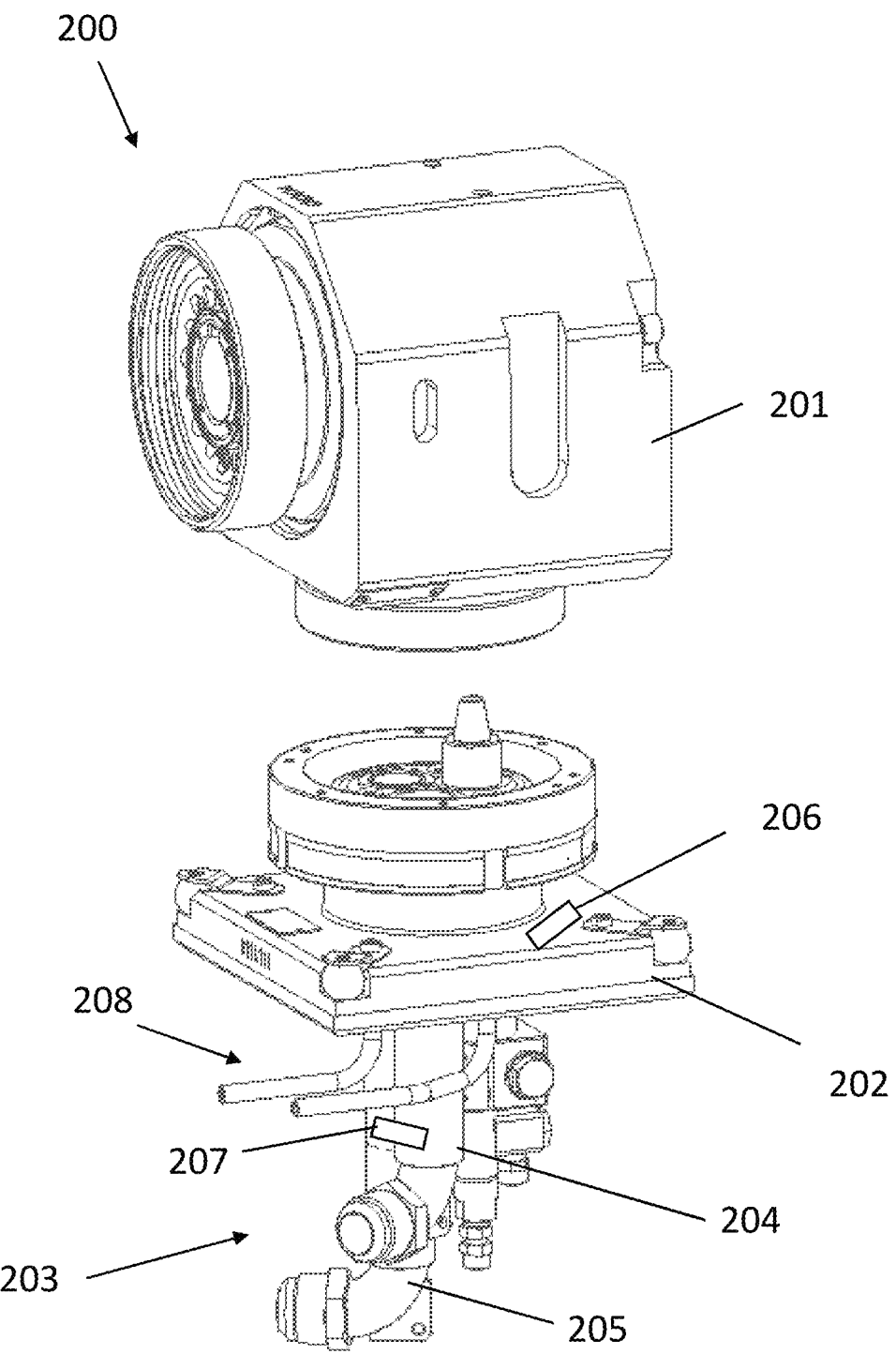
FIG. 2 illustrates a magnetron structure in accordance with embodiments of the present invention in exploded view, including a cooling (sub)system.

FIG. 1 and FIG. 2 show two exploded views of different types of magnetron structures 100, 200, including a top portion 101, 201 and a bottom portion 102, 202. The top portion 101, 201 is used for mounting the target, while the bottom portion serves as a link between the top portion and external subsystems (typically positioned outside the vacuum system), such as motors, cooling systems, etc. The magnetron 100 of FIG. 1 is a magnetron providing driving functionality such that the cylindrical target can be driven. The magnetron 200 of FIG. 2 provides cooling and powering functionality for introducing cooling fluid for cooling the target and for putting the target at a sputtering voltage. However, the present invention is not limited to these types of magnetrons. Functionalities as described above all may be concentrated in a single magnetron or be split differently over different magnetrons. Furthermore, the bottom part and the top part may be an integral piece.

The magnetron shown in FIG. 1 includes a top part 101 that can be attached to the bottom part 102, for example by screwing the threaded neck 103 of the top part 101 to the corresponding piece 104 of the bottom part 102. Any other suitable connection system may be used. In the example of FIG. 1, a motor set 105 is linkable to the bottom part 102, which can transmit driving power of the motor 105 to the top part 101 of the magnetron 100. The top part 101 then rotates a rotatable target attached thereto. In some embodiments of the present invention, the motor set may be also integrated in a single piece with the top part.

According to an embodiment of the present invention, a controller 106, optionally including a processor (e.g. a processing unit), can be included in the top part 101 of the magnetron (e.g. attached to a static part). However, it could also be included in the bottom portion, e.g. attached thereto.

In the case of FIG. 2, a cooling circuit 203 is included in the bottom part 202 for introducing cooling fluid (e.g. water, treated water, any other suitable liquid, or gas) in the target through the top part 201 via an inlet 204 and for evacuating the used cooling fluid via an outlet 205. In this particular example, electrical power is connected to the bolt 208 above the inlets and outlets, the power being transferred through a pin of the baseplate to the top part 201. A controller 206 including a processor can be attached to the top part or the bottom part of the endblock.

In some embodiments, the controller 206 may be positioned at the vacuum side of the magnetron structure, thus allowing direct transmission of any signals from the inside of the unit. The present invention is not limited to this configuration, and the integrate circuit may be placed on the atmospheric side of the magnetron structure, for example for processing data related to functionalities of cantilevered magnetrons.

In any case, wherever the controller is attached, it advantageously is protected from material deposited from the sputtering process, from the plasma, cooling fluid, etc.

In some embodiments of the present invention, at least one sensor or actuator 207 may be included in the magnetron itself, thus obtaining a highly integrated magnetron. For example, the sensor or actuator may be part of the controller of the magnetron. In situ monitoring can be obtained, for example during sputtering, in a compact way with no need for the used to perform further installations or connections.

By way of illustration, embodiments not being limited thereby, examples of monitoring and/or controlling of particular parameters in the controller in the magnetron structure will further be described.

Examples of Monitoring.

Power Monitoring

A signal can be provided to the controller 206, for example from at least one sensor (not pictured), which may sense parameters related to the sputter power, for example voltage provided to the target, electrical current through the system, spectral content of the signal (e.g. changes of the AC shape, frequency, etc.), impedance, etc. This may provide information regarding surges, stability of the process, status of the power transmission, issues regarding the target such as arcing, etc. A sensor for generating such signals can be included in the magnetron, for example as part of the controller. For example, the sensor may detect the status of the power transmission. For example, the status of brushes (used to transfer the power from the static part of the magnetron to the rotating part of the magnetron) can be sensed, to detect wear and the like (for example by monitoring the resistance). Additionally or alternatively, the sensor signal may be provided from outside the magnetron structure but e.g. within the vacuum system.

Sensors for sensing electric parameters, such as resistance sensors, voltmeters, current sensors, detectors of wave shape, and the like can be used. They may measure these parameters locally on the target or in the magnetron, or at an input port for an electrical signal into the unit, or the like. Measuring directly on the magnetron structure, rather on the power supply as usual, gives a richer signal, form which more accurate information can be obtained. In existing setups, long cabling has to be used for obtaining the measurements, which causes that signal at the power supply does not reflect the exact signal close to the target. Cabling may have impedance losses, so that the actual impedance of the plasma cannot be readily measured at the power supply. Furthermore, signals with high frequency may be attenuated by the connection line. This effect makes the investigation of signal disturbances difficult. These disturbances are an important source of information, as they may be caused by plasma oscillations, or physical limitations in target finish or in the power transfer means of the magnetron. In embodiments of the present invention, measuring at the target provides a faster and more accurate signal without capacitive or inductive losses from cables and/or magnetron connection systems.

The controller 206 collects the signal and provides processed data therefrom, thus providing information related to the monitoring of the sputtering process (e.g. the stability of the powering).

Cooling Fluid Monitoring.

In another example, a signal can be provided to the controller 206 of FIG. 2, for example from at least one sensor 207, which may sense parameters related to the cooling fluid, for example temperature of the fluid through the inlet 204, temperature of the fluid through the outlet 205 (and differences thereof), which can be used to assess the efficiency of the cooling process; it can alternatively or in addition thereto also sense parameters related to pressure, or to flow rate, which can be used to detect drops of surges of pressure, even to detect leaks. Another parameter may be resistivity of the cooling fluid, which can be useful for monitoring the amount of salts and other additives in the cooling liquid.

As before, the controller 206 collects the signal and advantageously provides processed data therefrom, thus providing information related to the monitoring of the cooling process.

The sensor again can be included in the magnetron, for example as part of the components of the cooling system present in the magnetron, e.g. in the top portion, or in the bottom portion. For example, flow sensors at the inlet and outlet can be used to measure the cooling fluid flow, and the controller may process and monitor the differential flow, which may allow e.g. detecting leakage. Additionally or alternatively, the sensor signal may be provided from somewhere else, for example from the parts of the target tube receiving the cooling fluid.

Monitoring of Magnetic Configuration

In some embodiments, the controller may capture and process sensor signals, obtaining information related to the magnetic configuration, e.g. one or more of the following non-exhaustive examples of sensor signals related to magnetics:

Type of magnet configuration, and/or positioning of the magnet configuration, for example globally (sensing of translational or rotational position, speed of movement, etc.), and/or locally (for example, from optical sensors, magnetic sensors such as Hall sensors, etc).

Temperature of the magnetic sources, as it can affect the strength of the magnetic fields, for example from thermocouples, thermopiles, etc.

Magnetic strength, for example at several points along a magnetron.

The controller collects the sensor signal and advantageously provides processed data related to the magnetic field, which can be used to monitor issues related to the plasma racetrack, ionic bombardment, efficiency of the process, etc. and thus more generally of the sputtering process or the sputtering apparatus.

Monitoring of Other Sputtering Apparatus Properties

In some embodiments, the controller 106, 206 may capture the following non-exhaustive examples of sensor signals or actuator settings related to the condition or functioning of the sputtering system, or even from the rest of the sputtering apparatus (such as from the vacuum chamber):

Temperature close to the target (e.g. the backing structure of the target).

Temperature on specific parts of the magnetron (housing, connections, seals, etc).

Pressure inside the system; e.g. some parts may be atmospheric or having a differential pressure between atmospheric and the pressure within the vacuum system and for potentially detecting a gaseous leak.

Humidity or sensors specifically adapted to detect cooling fluid outside the cooling system or outside the target; e.g. for checking and for potentially detecting a liquid leak.

The controller collects the sensor signal and advantageously provides processed data therefrom, related to the status of the magnetron, which can be used to monitor issues related to the sealings and the like.

For magnetrons for use with cylindrical targets, the controller can also handle information related to target driving, e.g. related to speed of target movement (e.g. target rotation), cumulative amount of rotations, which can be processed to provide monitoring of the operational lifetime. It is noted that, thanks to the processing performed by the electronic circuit, other properties (e.g. other properties also monitored by the controller) can be taken into account as weighting factor for the processing of the operational lifetime, such as load levels, temperature, etc.

Information regarding the electrical current, torque level, and its historical information (e.g. over time or within one revolution) can also be monitored, as well as the temperature of the driving unit.

Also, the status of the driving means in the magnetron, as well as the status of the bearings (e.g. pressure on the bearings) can be sensed, sent to the controller and processed into monitor data.

In some embodiments of the present invention, the processed data can be sent to the exterior of the vacuum part of the sputtering apparatus, for example to a readout (a screen, a monitor, a color-coded light panel, etc.), or an external memory, or even an external data processing unit, for further processing, e.g. data analysis or the like.

For data interchange, the magnetron structure may have an interface to external equipment for communication; this may be wireless (e.g. WIFI, Bluetooth, optical, or any other type of EM radiation . . . ) or wired having a connector (electrical, optical, . . . ) for transferring data.

Additionally or alternatively, the processed data could be stored in a memory included in the controller. For example, a historical record of the monitor data can be built, allowing long-term monitoring and follow up of the sputtering apparatus, which may be identified also by the controller in accordance with embodiments of the present invention.

Worsened conditions of the unit (aging of sealings or bearings, wear of contact brushes, higher friction or torque, augmented temperature, target consumption or damage or any other property) can, based on such historical data, be detected early, before the damage extends to other parts or worsens the sputtering process.

In alternative or additional embodiments of the present invention, control data can be processed by the controller of the magnetron.

For example, control signals can be sent to the magnetron, the controller may provide processing of the signals, and the processed control data can be used to control actuators, which are connected to the controller. The magnetron structure, or the electronic circuit therein, may be adapted for controlling the actuators in accordance with the control data processed by the processor. Thus, only an input console is needed to control said actuators, with no need of processing power (computers) outside the vacuum part of the sputtering apparatus for controlling these actuators. The actuators may be outside the vacuum part of the sputtering apparatus (for example, an actuator of the power source or of the cooling system), or they may be in the sputtering apparatus (for example: on the magnetron, or at the valves of the gas inlet, or to a drive system) or even in the magnetron (for example: valves for the inlet of the cooling system, or to a drive system).

As before, an interface can be provided for transferring control data, which may be the same or different type as the interface for transferring monitor data.

Examples of Control

Without being exhaustive, examples of process controlling means and their corresponding process parameters, which may be processed by the magnetron structure as control data, are enumerated hereinafter:

Power supply: Process parameters related to the power supply are for instance the wave shape or the power level, e.g. voltage level or current level, which is related to the energy applied to the system. The power supply level is typically a global process parameter, i.e. the power supply level cannot be changed at one location only. A higher power supply level with else constant deposition parameters may for instance lead to a higher thickness. In a sputtering process, the power supply is typically hooked up to the magnetron for powering the target. However, in parallel, additional power supplies may be provided; e.g. for powering an active anode system or e.g. for powering an ion source.

In embodiments of the present invention, control data can be processed related to power supply and power supply level, including control of power of ion sources and/or of the magnetron.

Gas main supply: A process parameter related to the main gas supply is the gas flow. The gas distribution determines the location dependent partial pressure in a process chamber. The gas distribution is a complex parameter, as different gasses may come into play, being pure or with various mixing ratios. The influence of the gas main supply may be confined to extend beyond the size of the delivery system inside the process chamber.

Gas reactive supply: Process parameters related to the reactive gas supply are the gas distribution and the partial pressures involved, or the gas flow rate. A higher reactive gas flow will typically generate a lower sputtering rate. By changing the reactive gas flow, the thickness of the layer being deposited can be controlled; however, also its composition and performance may be influenced.

Target (e.g. speed of rotation). Actuators may be placed in the magnetron structure to tune the speed of rotation, for instance by tuning the driving system or directly the motor.

Magnetic configuration: Process parameters related to the magnetron are for instance magnetic field strength, magnet movement, or speed of rotation. Magnet movement includes magnet bar orientation and magnet bar position. The magnet bar position determines the plasma density, hence the sputter rate. The influence of the magnet bar may be local if the magnet bar comprises sections. A stronger local magnetic field yields a higher local sputter rate.

Anode: A process parameter related to the anode is the anode tuning level; e.g. the resistance to ground level.

Heating: A process parameter related to heating is a temperature level. Different temperatures can be applied at different locations.

Cooling fluid: A process parameter related to the cooling fluid may be flow, temperature, but also conductivity, purity, amount of debris (particles in the fluid that may wear e.g. dynamic seals). For instance, the controller may also be used for steering and/or controlling valves mounted inside the magnetron structure, for controlling (e.g. optimizing) the cooling fluid properties (for example flow rate, etc.).

Control may be provided externally, e.g. by sending signals to the controller which are processed, thus obtaining control data. The present invention is not limited thereto and control may be provided internally. For example, control of the target and/or of the magnetic configuration may be done internally, e.g. using the controller comprised in the magnetron structure, based on e.g. monitored data.

The control data may involve any of these enumerated parameters, or even combinations thereof. A parameter may be controlled by varying different actuators of different systems. Control data related to the magnet movement, for example, may be processed in the electronic circuit of the magnetron structure and may be used to influence said movement, e.g. the orientation of the bars, via actuators linked to the controller.

In some additional or alternative embodiments, the controller is adapted to both monitor the condition of the sputtering apparatus (or of the sputtering process) and control the sputtering apparatus (or the sputtering process).

In one example the controller of the magnetron structure may receive or capture sensor signals. The signals are processed into monitor data. As a response from the monitor data, the controller generates control data which can be used for controlling the sputtering process or parts of the sputtering apparatus. Thus, a feedback loop can be established with a good self-regulation of the process or of the sputtering apparatus. This can provide high stability to the sputtering, and less human feedback or need of intervention. In general, less human interaction may be needed, thus obtaining advantageously a highly automatized unit.

In this embodiment there is no strict need of connecting the actuators that can be controlled from the controller inside. During installation of the sputtering apparatus, it is only needed to connect the actuators and sensors to the circuitry of the magnetron structure, with no need to connect and configure the actuators and/or sensors to any external computer or control system. A compact, stable and modular unit is thus obtained, with a low number of connections to the exterior. A connection may still be provided if desired, for introducing initial settings, or external control (e.g. for overriding the feedback control), or for outputting monitor data or alarm signals generated in the controller based on the monitor data. This still allows human interaction, but less intensely. For example, the sputtering apparatus may be independent within a range of an operation point. For example, a system with a self-sustaining magnetron structure may be provided, in which only high level data may be transmitted to the outside. For example, usually maintenance is required during a coating process, for instance on a coater stop. The present invention enables the addressing of the rest of variations internally. This allows achieving the next coater stop smoothly, without intermediate failure.

Particular Examples of Combined Monitoring and Control

Several configurations of the magnetron including a controller, for controlling and/or monitoring the status of the sputtering process and the sputtering apparatus, can be provided. Any suitable combination of monitored data and control data can be used, for example, control of power when power levels drop, increase of cooling fluid flow if the monitor data shows increase of power levels or temperature or a combination of both, variation of sputter gas flow if the racetrack becomes unstable, and other combinations.

In a particular example of this feedback configuration, the controller of the magnetron structure can monitor the sputtering process and/or power. When the monitor data shows a stable sputtering and low power, based on this information, the controller can generate control data and control actuators of the cooling system to reduce flow of the cooling fluid, thus reducing fluid (e.g. water) consumption. However, the processor can be programmed to reduce the cooling fluid flow only within a predetermined range from a safe operation point. Otherwise, beyond this range (for example, if the control data shows that the flow would be reduced under a predetermined threshold), the controller can be programmed to notify an operator for verification.

In some applications, magnetrons may be heated causing energy loss, thermal expansion and aging, which can damage vacuum seals, cooling fluid seals, etc. In some embodiments of the present invention, sensors in the housing or in the magnetron may detect the temperature and/or thermal expansions and the signals can be sent directly to the controller for processing. The one or more sensor signals are interpreted and, if the data shows that the signal surpasses a predetermined threshold, the processed data may be used to generate a control data for controlling an alarm outside the magnetron unit, or control data to reduce the powering and/or frequency and/or rotation speed, or any of a multitude of parameters. In particular embodiments, the sensor for monitoring the status of the magnetron structure can be part of the controller, obtaining a highly compact arrangement.

In a particular example, a sensor may be included in the magnetron structure which senses torque. The controller may capture the sensor signals (e.g. the sensor signals may be sent to the controller for processing), and the processor interprets the signals into monitor data, thus monitoring the torque of the target. The processor may be programmed to set off an alarm, for example by sending a signal to an alarm system, if the torque does not fall within a predetermined range, which may mean that the target is not well attached to the magnetron, or that there is too much friction. The monitor data may also show a periodic change of torque, which may mean that the target has a deformation (e.g. is bent) and scratches some component of the sputtering apparatus. The torque data can also be linked to the speed of the target, which can be introduced directly via a data interface or it can be also sensed.

Examples of Controllers

The controller, in order to provide processed data, may include a processor. It can be programmed to process sensor signals (e.g. signals generated by, and captured from, sensors), thus providing monitor data. In such case, the controller may comprise signal input, for example optical input, electronic input (wired or wireless input, for example via radio frequency RF), pressure input, etc. Analog-to-digital and/or digital-to-analog converters can be included in the circuitry.

Additionally or alternatively, the processor can be programmed to generate control data from commands. In such case, an input for external commands may be included. In some embodiments, it can be programmed to generate control data from monitor data, for example from monitor data processed by the electronic unit itself, from sensor signals. The controller may be adapted for driving and controlling actuators in the magnetron structure, in general in the sputtering apparatus or in subsystems related thereof, which may be inside or even outside the vacuum part of the sputtering apparatus (cooling systems, power sources, etc).

The controller may include data storage (e.g. a memory) for storing data, lookup tables, algorithms and the like, which can be accessed by the processor and/or by external systems, for providing long-term monitoring, etc. The stored information may relate to monitor data (historical records, etc.), to control data (for control of actuators), or to data related to monitoring and/or controlling the sputtering process or sputtering apparatus.

The controller may be adapted to provide feedback, for example to control actuators in response to processed monitor data, and/or in response to comparisons of values from the monitor data and predetermined data on a memory.

The magnetron may have an interface to external equipment for communicating and interchanging the data with the external equipment; this may be wireless (e.g. WIFI, Bluetooth, optical, or any other type of EM radiation . . . ) or wired having a connector (electrical, optical . . . ) for transferring data to and from the controller. The interface may include a connector which extends through the magnetron and/or its housing, outside of the vacuum part of the sputtering apparatus, from which it can be connected to the external equipment via e.g. a wired connection. In some embodiments, as shown in FIG. 1, the interface 108 or the connector thereof comprises an antenna 109 for interchanging signals with the external equipment.

In some particular embodiments, the interface of the magnetron is able to transmit and/or receive data (monitor data and/or control data) and it is also able to receive power for powering the controller, for example using a single connector. The number of connections, wires and such can be reduced. This dual connector for data and power signals can be wired or wireless.

The interface may be part of the controller. In other embodiments, the controller may be connected to an interface which is remote from the rest of the circuitry, for example in a different position of the magnetron. For example, as shown in FIG. 1, the controller 106 may be in the top portion 101 of the magnetron, and it may interchange data with an interface 108 in the attachable bottom portion 102. The data interchange between the interface and the controller may be done via wired connection. It may also be done wirelessly, for which both the interface 108 and the controller 106 may include wireless data transmitters/receivers, thus obtaining a completely modular magnetron assembly, which is easy to replace and interchange. For example, different magnetron top parts may be used with the same bottom portion, and only the wireless connection between them needs to be paired.

The controller can be powered by a local source such as integrated batteries. In some embodiments of the present invention, the circuitry may be powered by extracting energy (for example, with a power extractor) from the available sources such as cooling fluid flow (hydraulic conversion), electrical powering of the target tubes and the like. In some embodiments, the circuitry may be powered by an external connector, which does not require maintenance such as opening the vacuum system of the sputtering apparatus to change the batteries.

The controller may comprise cooling systems. For example, the cooling system of the sputtering apparatus may provide cooling to the controller.

In some embodiments of the present invention, at least the processor may be a monolithic circuit, although more elements may be included as part of the controller.

Figure 3:
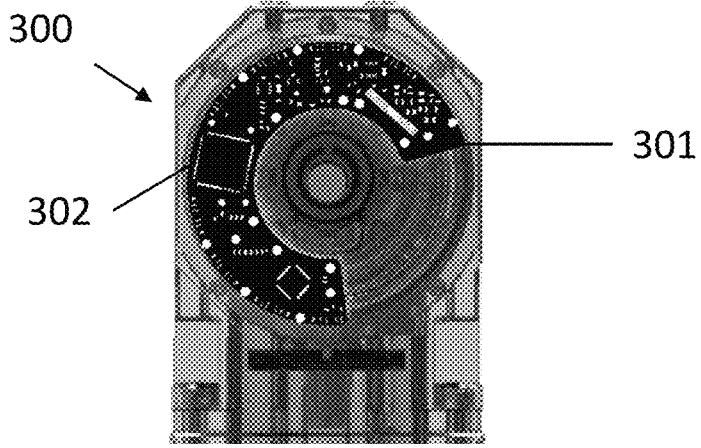
FIG. 3 illustrates a front view of an endblock, towards the ring where targets can be attached to, with an integrated circuit in accordance with embodiments of the present invention.

In some embodiments, as shown in FIG. 3, the controller is an integrated module 301, including a processor (e.g. monolithic processor 302), and further including ADCs, DACs, data connectors, signal input to capture sensor signals, drivers, even sensors and/or actuators. A highly integrated device is thus obtained, which can be fitted and tailored to specific geometries of the magnetron 300.

Figure 4:
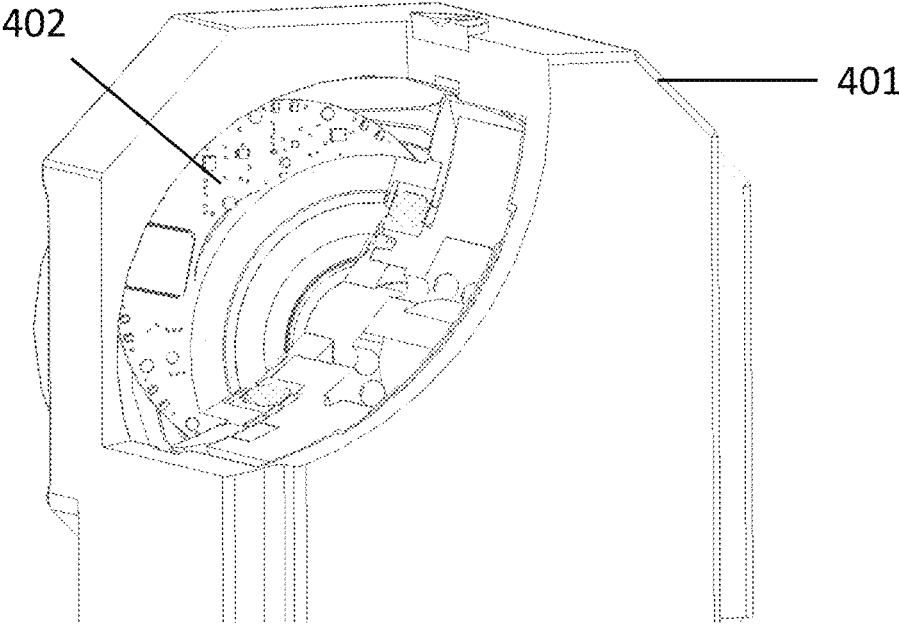
FIG. 4 illustrates a perspective view of an endblock with a section removed for better visualization, showing an exemplary placement of an integrated module including an integrated circuit, in accordance with embodiments of the present invention.

FIG. 4 shows a perspective view of a magnetron 401 with a section thereof removed for view of its interior. It is shown an exemplary placement of an integrated module 402, including a processor, embedded within the magnetron 401. The module 402 may be attached to the static portion of part 401, facilitating any needed connections. The geometry of the module 402 may be adapted to allow the introduction of any necessary power pins, cooling systems and the like. The example shown in FIG. 4 is an example of a single piece magnetron, not having a separate top or bottom part.

In a second aspect, the present invention provides a sputtering apparatus comprising at least one magnetron structure accordance with embodiments of the first aspect of the present invention.

Further features and characteristics may correspond with features of particular embodiments of magnetron structures as described in the first aspect of the present invention.

In a third aspect, the present invention relates to the use of a controller, in a magnetron structure for use in a sputtering apparatus. The magnetron structure may be used with, but it is not limited to, a rotatable magnetron sputtering source for use with tubular targets. The controller may be adapted (e.g. programmed) for monitoring parameters related to the sputtering process and/or the sputtering apparatus, or for controlling functionalities thereof, or a combination of both. The controller may be adapted for processing data into signals or vice versa. The controller may be completely integrable within the magnetron structure, for example within a top part of the magnetron, a bottom portion of the magnetron or the housing thereof. For example, the circuit or circuits forming the controller may be attached or integrated in a magnetron for use with a cylindrical target (e.g. to the base plate of an magnetron, or to the head thereof). Further features may correspond with the functionality of the components described in the first and the second aspect.

The invention claimed is:

1. A magnetron structure for use in a sputtering apparatus that comprises, when in operation, a vacuum part and an exterior non-vacuum part, the magnetron structure comprising:

a magnetron, a sensor for sensing sensor signals related to the sputtering apparatus or a sputtering process, and a controller rigidly connected to the magnetron, the controller comprising a data processor being adapted for receiving and processing the sensor signals from the sensor and being configured for processing the sensor signals into data for monitoring or controlling a status of the sputtering apparatus or components thereof or a status of the sputtering process;

wherein parts removable with a target are distinct from the magnetron structure, the controller being rigidly connected to the magnetron directly, the data processor thus, when in operation, being in the vacuum part of the sputtering apparatus.

2. The magnetron structure according to claim 1, wherein the controller further comprises data storage for storing the data related to the at least partly monitoring and/or controlling of a condition and/or a functioning of the sputtering apparatus.

3. The magnetron structure according to claim 1, wherein the magnetron is an endblock adapted for supporting a cylindrical magnet bar and sputter target.

4. The magnetron structure according to claim 1, wherein the controller further comprises a communication component for interchanging data with a further controller external to a vacuum part of the sputtering apparatus.

5. The magnetron structure according to claim 4, wherein the communication component is adapted for performing wireless communication using any of WIFI communication, Bluetooth communication, optical communication, or any EM radiation or for performing wired communication using any of optical fiber communication or electrical communication.

6. The magnetron structure according to claim 1, wherein the magnetron further comprises an actuation controller for controlling at least one actuator for adjusting a parameter related to the sputtering process in the sputtering apparatus.

7. The magnetron structure according to claim 1, the magnetron structure further comprising a power source for powering the controller, the power source being one of a battery or a power extractor adapted to obtain power from a cooling fluid flow or an electrical powering of a target tubes in the sputtering apparatus.

8. The magnetron structure according to claim 1, wherein powering of the controller is based on a wired connection from the exterior non-vacuum part of the sputtering apparatus.

9. The magnetron structure according to claim 1, wherein the magnetron comprises a top part for holding the target and a bottom part attachable to the top part, wherein the controller is rigidly connected to the bottom part.

10. The magnetron structure according to claim 1, wherein the structure comprises a wireless connector including an antenna for transmitting data to the exterior non-vacuum part of the sputtering apparatus.

11. The magnetron structure according to claim 1, wherein the data is any or a combination of cooling liquid related information, sputter power related information, magnetics related information, magnetron condition related information or target driving related information.

12. The magnetron structure according to claim 1, wherein the controller provides information for facilitating maintenance while being in use, giving information about its status and about the projected moment of required preventive maintenance.

13. The magnetron structure according to claim 1, wherein the controller provides information for facilitating maintenance while being in revision to understand the historic data thus facilitating adequate revision and maintenance.

14. The magnetron structure according to claim 1, wherein the controller is a microcontroller.

15. A sputtering apparatus comprising a magnetron structure according to claim 1 and a magnet configuration.

16. The magnetron structure according to claim 1, wherein the data is any or a combination of incoming temperature of a cooling liquid, outgoing temperature of the cooling liquid, pressure of the cooling liquid, flow rate of the cooling liquid or resistivity of the cooling liquid, voltage towards the target, voltage on specific parts, electrical current through the system, spectral content or impedance, type of magnet configuration, positioning of the magnet configuration, local positioning, temperature, magnetic strength, temperature close to the target, temperature on specific parts of the magnetron, pressure inside the system, rotation or movement speed, operational lifetime, driving unit electrical current or torque level over time or temperature of the driving unit.

17. The magnetron structure according to claim 1, wherein the controller is an integrated circuit.

18. The magnetron structure according to claim 1, wherein the controller is an integrated module being at least partly ring-shaped and thereby being tailored to geometries of the magnetron being an endblock for cylindrical targets.

19. A magnetron structure for use in a sputtering apparatus that comprises, when in operation, a vacuum part and an exterior non-vacuum part, the magnetron structure comprising:

a magnetron, a sensor for sensing sensor signals related to the sputtering apparatus or a sputtering process, and a controller rigidly connected to the magnetron, the controller comprising a data processor being adapted for receiving and processing the sensor signals from the sensor and being configured for processing the sensor signals into data for monitoring or controlling a status of the sputtering apparatus or components thereof or a status of the sputtering process;

wherein parts removable with a target are distinct from the magnetron structure, the controller being rigidly connected to the magnetron directly, the data processor thus, when in operation, being in the vacuum part of the sputtering apparatus, wherein the controller further comprises data storage for storing data over time related to the at least partly monitoring and/or controlling of a condition and/or a functioning of the sputtering apparatus.

* * * * *